United States Patent [19]

Lee

[11] Patent Number: 5,026,659

[45] Date of Patent: Jun. 25, 1991

[54] PROCESS FOR FABRICATING STACKED TRENCH CAPACITORS OF DYNAMIC RAM

[75] Inventor: Young J. Lee, Seoul, Rep. of Korea

[73] Assignee: Gold Star Electron Co., Ltd., Chung Cheong, Rep. of Korea

[21] Appl. No.: 534,927

[22] Filed: Jun. 7, 1990

[30] Foreign Application Priority Data

Aug. 23, 1989 [KR] Rep. of Korea ............... 12019/1989

[51] Int. Cl.$^5$ ............................................ H01L 21/70
[52] U.S. Cl. ....................................... 437/52; 437/38;
437/47; 437/51; 437/60; 437/191; 437/193;
437/203; 437/228; 437/233; 437/235; 437/919
[58] Field of Search .................. 437/38, 47, 51, 52,
437/60, 193, 195, 228, 233, 235, 919; 357/23.6

[56] References Cited

U.S. PATENT DOCUMENTS

| 4,864,375 | 9/1989 | Teng et al. | 357/23.6 |
| 4,873,560 | 10/1989 | Sumami et al. | 357/23.6 |
| 4,939,104 | 7/1990 | Pollack et al. | 357/23.6 |

FOREIGN PATENT DOCUMENTS 0278268 11/1988 Japan ................................. 357/23.6

OTHER PUBLICATIONS

Toru Kaga et al., "Half Vcc Sheath-Plate Capacitor Dram Cell With Self-Aligned Buried Plate Wiring", IEEE Transaction on Elect. Devices, vol. 35, No. 8, Aug. 88, pp. 1257–1263.

Watanake, H., Kurosawa, K. and Sawada, S., Stacked Capacitor Cells for High-Density Dynamic RAMS, 88 IEDM, 600–603, 1988.

Horiguchi, F., Nitayama, A., Hieda, K., Hamamoto, T., Tsuda, K., Sunoushi, K., Takenouchi, N., Aritome, S., Takato, H. Kimura, M., Yamake, K., Nakase, M., Kamata, Y., and Masuoka, F., Process Technologies for High Density, High Speed 16 Megabit Dynamic RAM, 87 IEDM 324–327, 1987.

Primary Examiner—Brian E. Hearn
Assistant Examiner—Tom Thomas
Attorney, Agent, or Firm—Faegre & Benson

[57] ABSTRACT

A process for fabricating a stacked trench capacitor of a DRAM by way of the anisotropic dry etch technique of CVD silicon. In the process, sidewalls are formed by the anisotropic dry etch of CVD silicon which is formed within a trench for good electrical isolation between trenches, and upon the wet etch of an oxide film, are served as blocking layers to leave an oxide film layer for isolation in the side surfaces of the trenches. In the bottom part of the trenches in which the oxide film is removed, the ion implantation is performed with dopants having an opposite type in relation to the impurity diffusion area of a transistor for isolating the whole of the trenches effectively. Also, on the slant trench in which sharp edges do not exist the thin dielectric layer is formed to eliminate electrical weakspots.

11 Claims, 5 Drawing Sheets

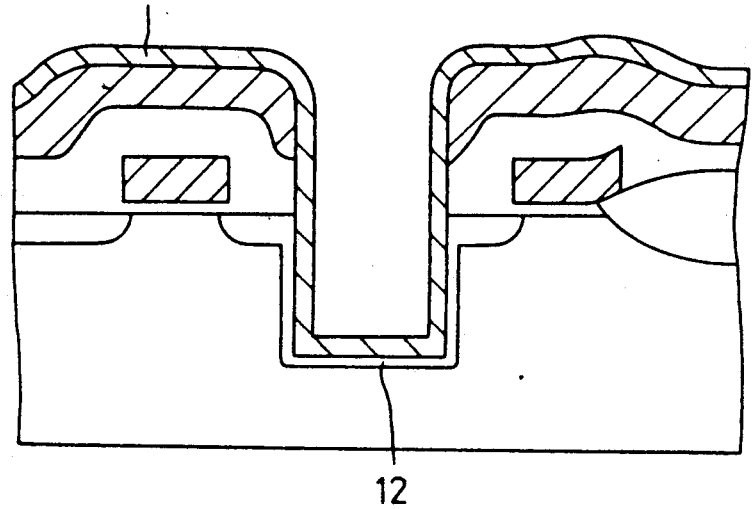
F I G. 1C
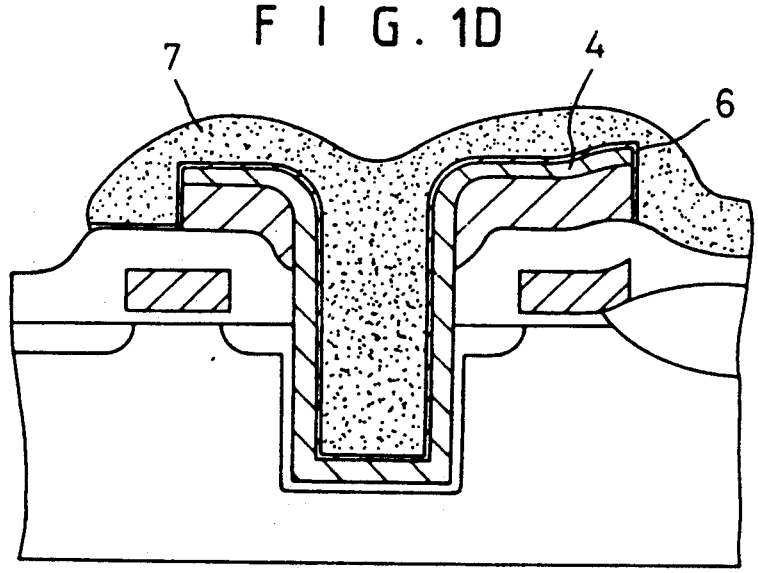
F I G. 1D

F I G. 1E
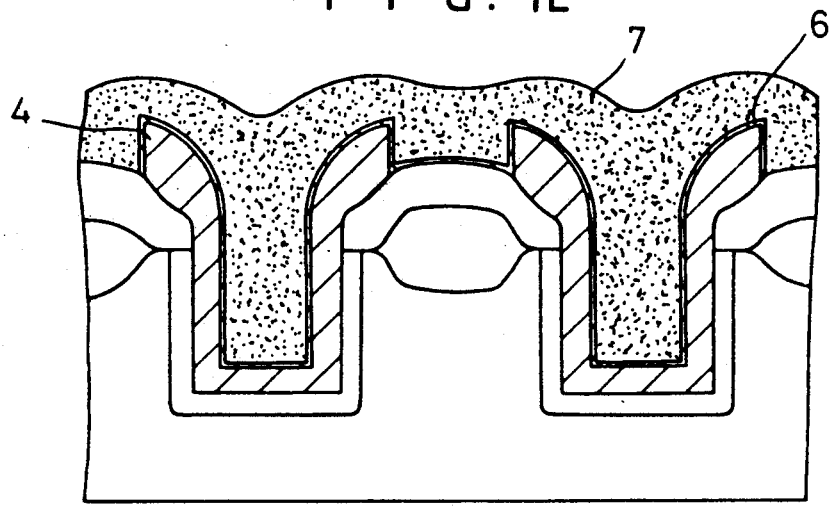
F I G. 1F
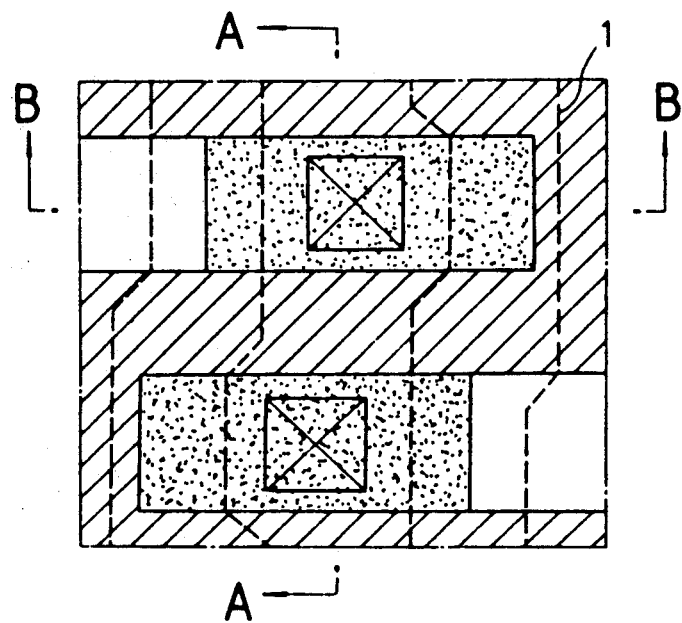

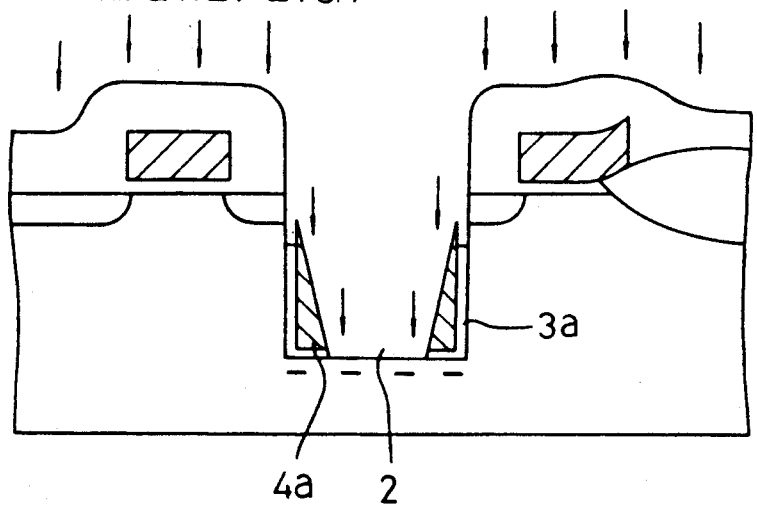
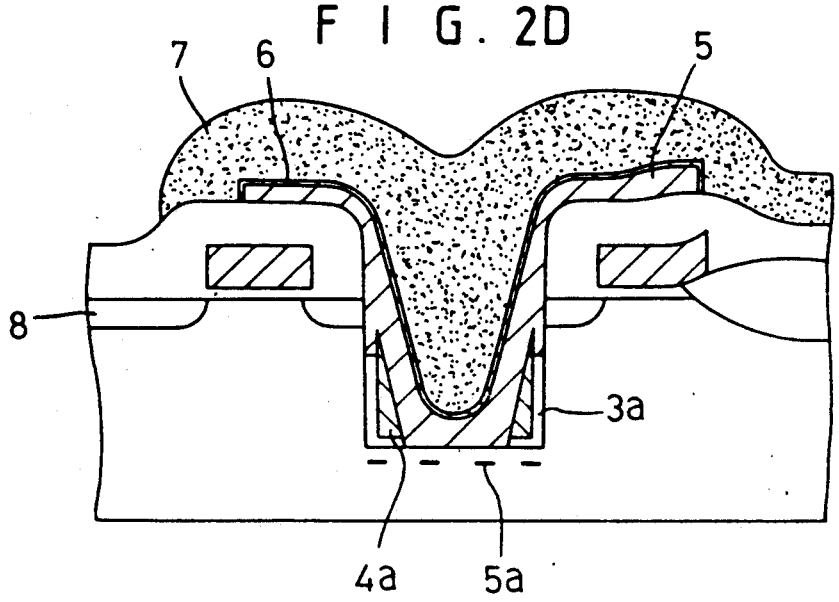

PROCESS FOR FABRICATING STACKED TRENCH CAPACITORS OF DYNAMIC RAM

BACKGROUND OF THE INVENTION

1. Field of the Invention

This invention relates to a process for fabricating the stacked trench capacitor (STC) of a dynamic random access memory (DRAM), particularly to the process for fabricating the STC structures which are electrically isolated between trenches.

In the present invention, the side wall of the trench, which is encapsulated by a thermal oxide layer, is covered with a side-spacer silicon layer by deposition and subsequent anisotropic dry etch of the CVD silicon. Since the oxide film which is not protected by a side-spacer silicon layer is removed by wet etch, only the side wall of the trench is covered by an oxide/silicon bilayer. The oxide film serves as an insulating layer to eliminate the trench-to-trench leakage current. The electrical isolation is also improved by ion-implantating the dopants underneath the trenches. Further, since the inventive capacitor structure consists of a sloped shape of trench side wall and has no sharp edges, electrical weak spots of the capacitors can be eliminated.

2. Description of Related Art

In order to realize the stacked capacitors for a high density DRAM, a shallow trench is made into a silicon substrate to increase the capacitor area, hence increasing the capacitance. Conventional processing procedures are as follows:

First, as shown in FIG. 1 A, the CVD oxide 10 and poly silicon films 11 are sequentially deposited on the gate 1. As shown in FIG. 1 B, a trench 2 is made by opening the contact window and etching down into a silicon substrate 9 using reactive ion etch (RIE). A poly-silicon layer 4 which serves as a storage node is deposited by CVD, and doped using ion implantation or diffusion from dopant vapor source, as shown in FIG. 1 C. And then, a capacitor area is defined by photo and etch. Finally, as shown in FIG. 1 D, the thin dielectric 6 layer is formed on the storage node poly silicon. Finally, the entire capacitor area is covered by poly-silicon. Finally, the entire capacitor area is covered by poly-silicon 7 for the opposite electrode. In the conventional art, the subsequent high temperature processes after doping the poly-silicon layer 4 lead to out diffusion of dopant from the poly-silicon layer to silicon substrates 9 forming a diffused region 12 around the trench. Formation of diffused region in contact with drain junction increases the contact area between capacitor and the junction.

However, in the conventional art described above, the presence of the dopant diffused regions 12 around the trenches cause a significant leakage current between trenches as shown in FIG. 1 E, which is a cross sectional view taken along line A—A in FIG. 1 F. The problem of leakage current between trenches becomes more significant as the spacing of the trenches decreases and/or the depth of the trenches increases. Another drawback of this structure is that since a vertical shape of the trench is formed after deposition of poly-silicon layer 4, the thin dielectric layer 6 formed later has electrical weak spots at the sharp edges in the bottom part of the trench. Therefore, this capacitor structure causes leakage current between the capacitor electrodes, and hence degrading the reliability of the capacitor.

OBJECT OF THE INVENTION

The object of the present invention is to provide a process method which overcomes the drawbacks of the conventional art described above. The present invention provides an improved method for reducing leakage currents between trenches n the conventional STC structure. The present invention also provides an improved method for enhancing the reliability of the thin dielectric layer in the STC structure.

SUMMARY OF THE INVENTION

In the present invention, the processing procedures of STC structure of a DRAM which reduces the trench-to-trench leakage current are described. The bare surface of the trenches between the transistor gates is covered by a thermal oxide layer. The bottom of the trench is ion-implanted with a type of dopants opposite to that of source/drain of the transistor (e.g., p-type dopants for N-MOS). The portion of side wall of trench below the junction is selectively covered by side-spacer silicon layer utilizing the anisotropic RIE of CVD silicon. The thermal oxide layer which is not protected by side-spacer silicon layer is wet etched off. On this trench structure, the capacitor is fabricated by depositing silicon layer (storage node), thin dielectric layer, and another silicon layer (opposite plate) sequentially.

BRIEF DESCRIPTION OF THE DRAWING

The process of the invention will be more visually described using the accompanying drawing in which:

FIG. 1 E is a cross sectional view taken along the line A—A in FIG. 1 F.

FIG. 1 F is a plane view of the conventional DRAM cell.

DETAILED DESCRIPTION OF THE INVENTION

The procedure of the process of the present invention will be described in detail, taking an example of fabricating STC structure with a N-MOS transitor*.

Figure 1A:
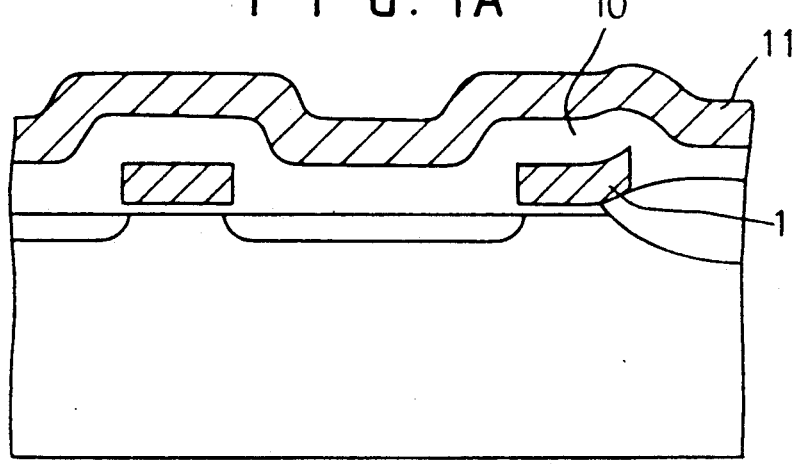
FIG. 1 A. through 1 D are cross-sectional views taken along with the line B—B in FIG. 1 F for explaining the processing sequence of the conventional art process.
Figure 1B:
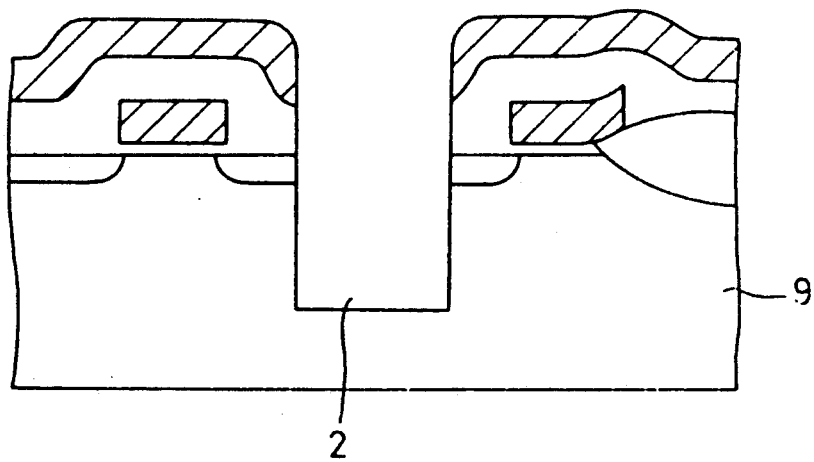
Figure 2A:
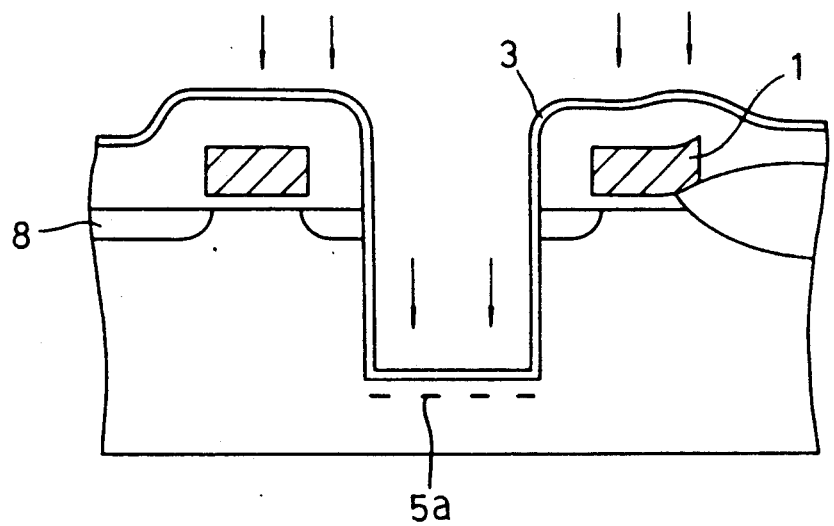
FIG. 2 A through 2 D are cross sectional views taken along the line B—B in FIG. 1 F for explaining the processing sequence of the present invention.
Figure 2B:
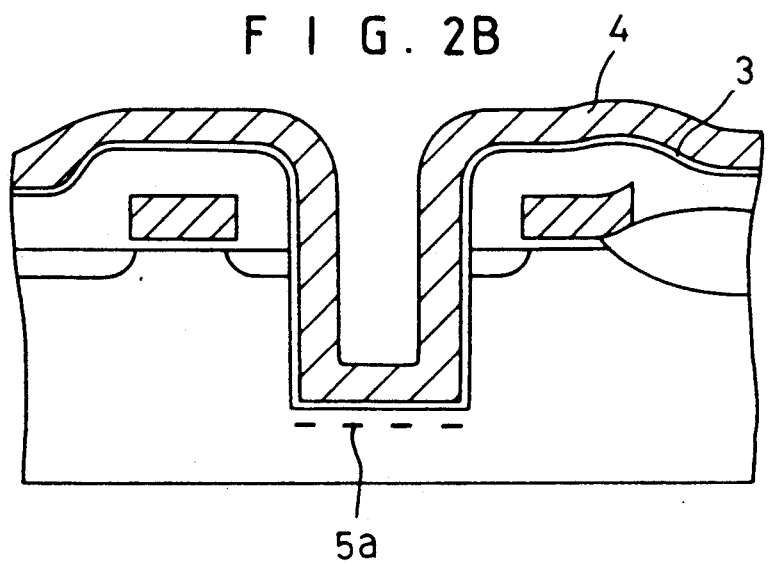

Referring to FIGS. 2 A through 2 D, the processing sequence of the present invention is described.

First, as shown in FIG. 2 A, the trench is formed between transistor electrodes using the photolithography and RIE technique. And then an oxide film 3, which is several hundred angstroms thick, is thermally grown in a diffusion furnace.

Next, the P-type dopants 5a are ion-implanted for providing an electrical isolation in the bottom of the trench 2. The dose and energy of the ion implantation are decided considering thickness of the oxide layer, doping level of the storage node silicon layer 5 deposited as shown in FIG. 2 B later and ion-implantation damages.

After the ion implantation, an undoped poly or amorphous silicon layer 4 is deposited to a thickness of 1500 to 3000 angstrom as shown in FIG. 2 C, the silicon layer 4 is anisotropically etched by RIE leaving only the side spacer silicon layer 4a covering the side wall of the trench 2 which is below the N+ junction region 8 of the transistor.

Subsequently, the thermal oxide film 3 is wet etched so that the exact portion of the side wall of the N+ junction region is opened. In this process, the oxide film 3a covering the side wall deeper than the junction 8 can be survived, since it is protected by side-spacer silicon layer 4a. The 1000-3000 angstrom thick silicon layer 5, which serves as a storage node of the capacitor, is deposited as shown in FIG. 2 D. The capacitor region is defined using conventional photo and etch.

And then, the thin dielectric layer 6 is deposited, and subsequently covered by poly-silicon 7 for the opposited plate.

The STC structure fabricated by the invented process described above has advantages over conventional one in following aspects.

(1) The presence of the oxide layer at the sidewall of the trenches prevents the leakage of current through the side walls of trenches.

(2) The silicon substrates 5a underneath the bottom of the trench 2 is doped with p-type dopant, which reduces the current leakage through the bottom of the trenches.

(3) Since the storage node silicon layer 5 has smooth concave-shaped corners around the bottom of the trench, the thin dielectric layer can be deposited with a uniform thickness and without electrical weak spots where the charges may leak. In this way, more reliable capacitors with a reduced current leakage between the electrodes can be fabricated.

Because of the described beneficial features, the present STC structure can be applied for a high-density DRAM above 4M where the trench is deeper and the spacings between trenches narrower.

While the described embodiment represents the preferred form of the present invention, it is to be understood that modifications of the present processes will occur, however, without departing from the spirit of the invention. The scope of the invention is therefore to be determined solely by the appended claims.

What is claimed is:

1. A process for fabricating a stacked trench capacitor (STC) of DRAM, comprising the steps of:
   forming trenches between transistor gate electrodes and growing a thermal oxide film for preventing current leakage through side walls of the trench;
   ion implanting a bottom of the trench with dopants of an opposite conductivity type to those of a transistor source or drain gradient for preventing current leakage through the trench bottom;
   forming a side-spacer silicon layer on a side wall of the trench by depositing a first silicon layer thereon and performing an anisotropic reactive ion etch on said side-spacer silicon layer;
   performing wet etch on the thermal oxide film which is unprotected by the side-spacer silicon layer and then depositing a subsequent silicon layer for a storage node of the capacitor; and
   forming a dielectric layer and capacitor plate.

2. A process according to claim 1, wherein the thermal oxide film is grown to several hundred angstroms thickness in a diffusion furnace.

3. A process according to claim 1, wherein the side-spacer silicon layer is an undoped poly or amorphous silicon layer deposited to a thickness of 1500-3000 angstroms.

4. A process according to claim 1, wherein the first silicon layer is anisotropically etched using reactive ion etch, so that a resultant side-spacer silicon layer covers only a portion of a sidewall of the trench which is deeper than a transistor junction depth.

5. A process according to claim 1, wherein the type of dopants for ion implanting are p-type for NMOS.

6. A process according to claim 1, wherein the silicon layer which serves as a storage node is deposited to a thickness of 1000-3000 angstroms, which comes into contact with a lateral surface of a junction region of the transistor.

7. A process according to claim 1, wherein the subsequent silicon layer, which serves as a storage node of a capacitor, is deposited to a thickness of 1000-3000 angstroms.

8. A process according to claim 7, wherein the subsequent silicon layer comes into contact with a lateral surface of a junction region of the transistor by opening the thermal oxide layer using the wet etch.

9. A process for fabricating a trench capacitor by anisotropic etch of poly silicon comprising the steps of:
   forming a trench and growing a thermal oxide film for preventing current leakage through side walls of the trench;
   ion implanting with an opposite type of dopants to those of transistor diffusion area for preventing current leakage through a bottom of the trench;
   forming a side-spacer silicon layer on a side wall of the trench by depositing a silicon layer and performing anisotropic reactive ion etch on said side-spacer silicon layer;
   performing wet etch on a thermal oxide film which is not protected by the side spacer silicon layer and then depositing a silicon layer for a storage node of the capacitor; and forming a thin dielectric layer and capacitor plate.

10. A process according to claim 9, wherein the thermal oxide layer is grown to several hundred angstroms thickness in a diffusion furnace.

11. A process according to claim 9, wherein after ion implantation, undoped poly or amorphous silicon layer for a side-spacer is deposited to a thickness of 1500-3000 angstroms.

* * * * *

UNITED STATES PATENT AND TRADEMARK OFFICE
CERTIFICATE OF CORRECTION

PATENT NO. : 5,026,659

DATED : June 25, 1991

INVENTOR(S) : Young J. Lee

It is certified that error appears in the above-identified patent and that said Letters Patent is hereby corrected as shown below:

Column 3, line 51, after "to" delete --those of--

Signed and Sealed this

Sixteenth Day of March, 1993

Attest:

STEPHEN G. KUNIN

*Attesting Officer*    *Acting Commissioner of Patents and Trademarks*